(12) United States Patent
Jain (10) Patent No.: US 11,170,830 B2
(45) Date of Patent: Nov. 9, 2021

(54) WORD LINE DRIVER FOR LOW VOLTAGE OPERATION

(71) Applicant: Taiwan Semiconductor Manufacturing Company Limited, Hsinchu (TW)

(72) Inventor: Sanjeev Kumar Jain, Ottawa (CA)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/787,415

(22) Filed: Feb. 11, 2020

(65) Prior Publication Data

US 2021/0249059 A1 Aug. 12, 2021

(51) Int. Cl.
*G11C 8/08* (2006.01)

(52) U.S. Cl.
CPC ....................................... *G11C 8/08* (2013.01)

(58) Field of Classification Search
CPC ........................................................ G11C 8/08
See application file for complete search history.

(56) References Cited

U.S. PATENT DOCUMENTS

| | | | | |
|---|---|---|---|---|
| 5,596,539 A * | 1/1997 | Passow | ................. | G11C 7/08 365/189.11 |
| 8,040,719 B2 * | 10/2011 | Cho | ................. | G11C 13/004 365/163 |
| 8,270,247 B2 * | 9/2012 | Sasaki | ................. | G11C 8/08 365/230.06 |
| 8,467,263 B2 * | 6/2013 | Kulkarni | ................. | G11C 8/08 365/230.06 |
| 9,030,863 B2 * | 5/2015 | Gulati | ................. | G11C 11/419 365/156 |
| 9,171,634 B2 * | 10/2015 | Zheng | ................. | G11C 7/12 |
| 9,552,854 B1 * | 1/2017 | Bonakdar | ................. | G11C 7/14 |
| 9,721,647 B2 * | 8/2017 | Ishii | ................. | H01L 27/1116 |
| 10,431,295 B2 * | 10/2019 | Wang | ................. | G11C 11/417 |
| 10,658,028 B2 * | 5/2020 | Ishii | ................. | G11C 5/063 |

* cited by examiner

*Primary Examiner* — Vanthu T Nguyen
(74) *Attorney, Agent, or Firm* — Jones Day (57) ABSTRACT

Systems and method are provided for a word line driver. A first supply branch is configured to provide a source voltage level for a word line. A second supply branch is configured to provide a boosted voltage for the word line. The word line driver is configured to apply the source voltage level to the word line based on a first selection signal, and the word line driver is configured to apply the boosted voltage to the word line based on a second selection signal, the second selection signal being delayed relative to the first selection signal.

20 Claims, 8 Drawing Sheets

WORD LINE DRIVER FOR LOW VOLTAGE OPERATION

BACKGROUND

Word lines in dynamic random access memory (DRAM) and static random access memory (SRAM) are commonly heavily loaded. For example, in some memory architectures, a word line is coupled to about one thousand (1K, 1024) to four thousand (4K) memory cells. In nano-scale technologies, a width of the word lines is narrow, and a resistance of the word lines can be high. These factors can cause a propagation delays and voltage drops along the word lines, affecting performance of the DRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Power consumption concerns are often a primary factor in integrated circuit design, particularly design of mobile devices with limited power storage capability (e.g., stored battery power). A supply voltage level of an integrated circuit is related to an amount of power consumed by the integrated circuit. That is, reductions in a supply voltage level (i.e., the voltage level provided to a power input (e.g., Vdd, Vss pin) of an integrated circuit) can enable a corresponding reduction in power consumption of that integrated circuit.

Reductions of supply voltages to an integrated circuit may be limited by the power needs of components within the integrated circuit. For example, an integrated circuit may include transistors that require certain voltage levels for operation. Those transistors, such as ones within memory cells, may be activated by a voltage applied to a word line of the memory cell to perform read and/or write operations. The transistors of each memory cell may require that at least an activation voltage level be applied to initiate operation. In a best case scenario, the supply voltage for the integrated circuit would be equal to that activation voltage level.

But in real-life circuits, non-ideal conditions in a circuit may result in actual voltages received at a component being different than those envisioned during design. For example, conducting paths that may be modeled as having negligible resistance may, in actuality, have material resistances associated with them. For example, word line/bit line resistances in small scale technologies (e.g., N5/N3) may have material resistances that result in voltage drops across their lengths. Thus corresponding word line and bit line drivers operating at a supply voltage may not be able to provide that supply voltage to components (e.g. transistors) that may require that supply voltage for proper operation. While such an adverse effect might be remedied by increasing the supply voltage, such a fix may be suboptimal in some instances due to an increased power drain caused by the supply voltage increase.

Systems and methods described herein can, in embodiments, provide a boosted voltage on conductors, such as to compensate for resistive voltage drops. In embodiments, voltage boosting is timed so as to provide a control signal voltage substantially equal to or greater than a supply voltage to components (e.g., based on signal propagation delays associated with the control signal).

Figure 1:
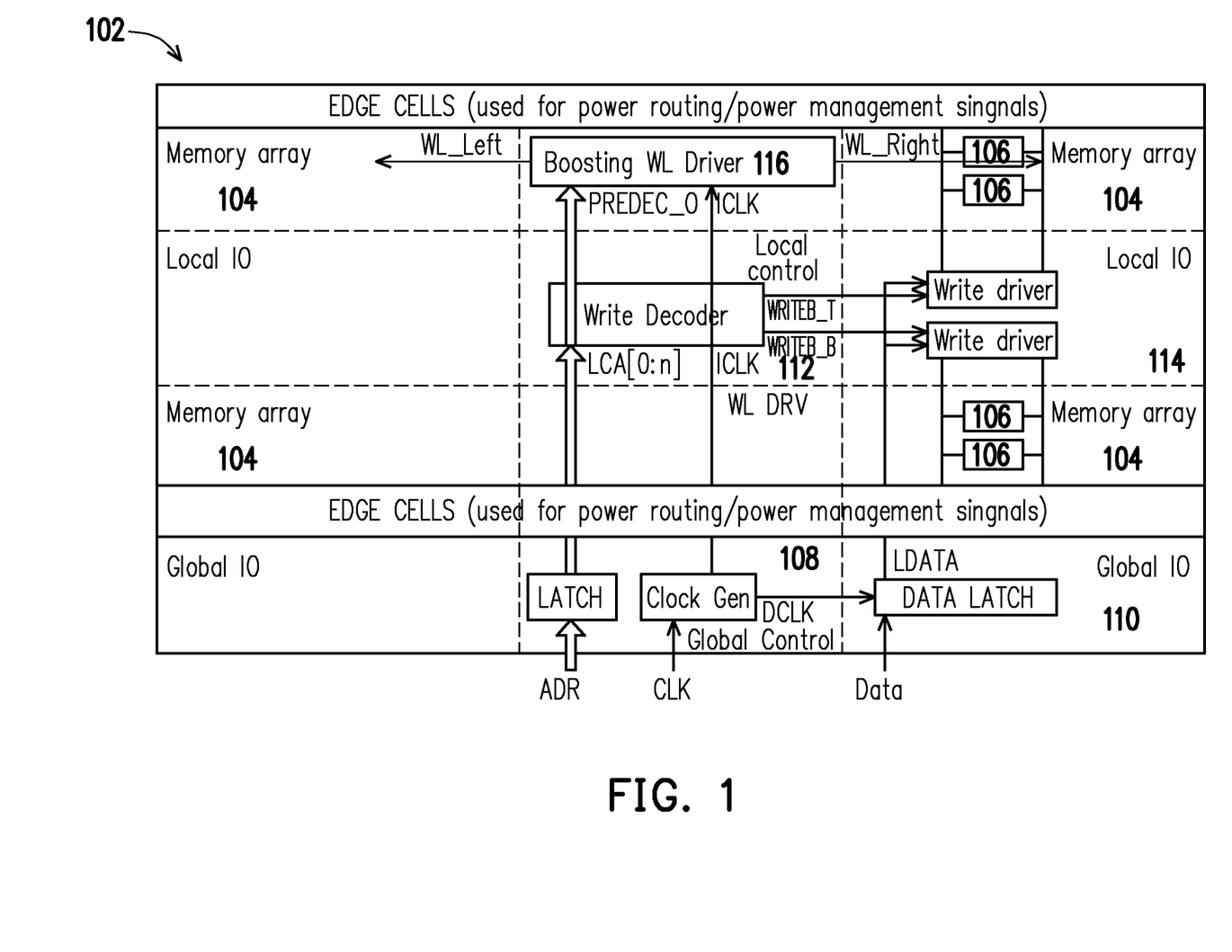
FIG. 1 is a diagram depicting a memory circuit that includes a boosting word line driver in accordance with embodiments.

FIG. 1 is a diagram depicting a memory circuit that includes a boosting word line driver in accordance with embodiments. The memory circuit 102 includes a plurality of memory array portions 104 positioned across cells of the circuit. Each memory array includes rows of memory cells (e.g., 106), referred to herein as words of memory controlled by word lines (WL). Certain cells (e.g., 108, 110) positioned on the edge of the FIG. 1 layout provide power routing (e.g., receive a source voltage at a source voltage level, receive a higher supply voltage that is stepped down), receive external commands, receive input data, and provide output data. For example, cell 108 is configured to receive command signals (e.g., a read or write command signal) and an address signal comprising a plurality of bits indicating where the designated command is to be performed. Cell 108 further receives a clock signal that is distributed to other cells as a data clock (DCLK) and an internal clock (ICLK). Cell 110 includes a data latch that is configured to receive input data from outside of the circuit for writing to memory cells and to receive output data from the memory cells to transmit from the circuit.

Certain cells, centrally located in the example of FIG. 1, provide targeted control signals to the memory cells. For example, a local control cell 112 includes a write decoder module that determines whether commands received at cell 108 pertain to one of the cells in the vicinity of that local control cell 112. Specifically, the write decoder considers a portion of an address received at 108 and determines whether any of the four local memory arrays 104 (e.g., left-upper bank, right-upper bank, left-lower bank, right-lower bank) is an intended recipient of a command. If one of those arrays 104 is intended as discerned from a pre-decoding operation, then the command is propagated to the designated array. If not, the command is ignored at 112 and the command and associated address are propagated to other local control cells.

As described further herein, local IO cells (e.g., 114) provide control signals (e.g., word line signals) at a boosted level for periods of time to counteract real-life circuit conditions, such as conducting line resistances. Upon receipt of a command from local control cell 112 (a write-bar-top-array (WriteB_T) command, a write-bar-bottom-array (WriteB_B) command) a commanded boosting WL driver 116 provides a control signal that meets the voltage level required by components (e.g., memory cell transistors) for proper operation by providing a boosted voltage level for a period of time (e.g., a portion of) during the control signal to either/both of a left memory array (via WL_Left) and a right memory array (via WL_Right).

Figure 2:
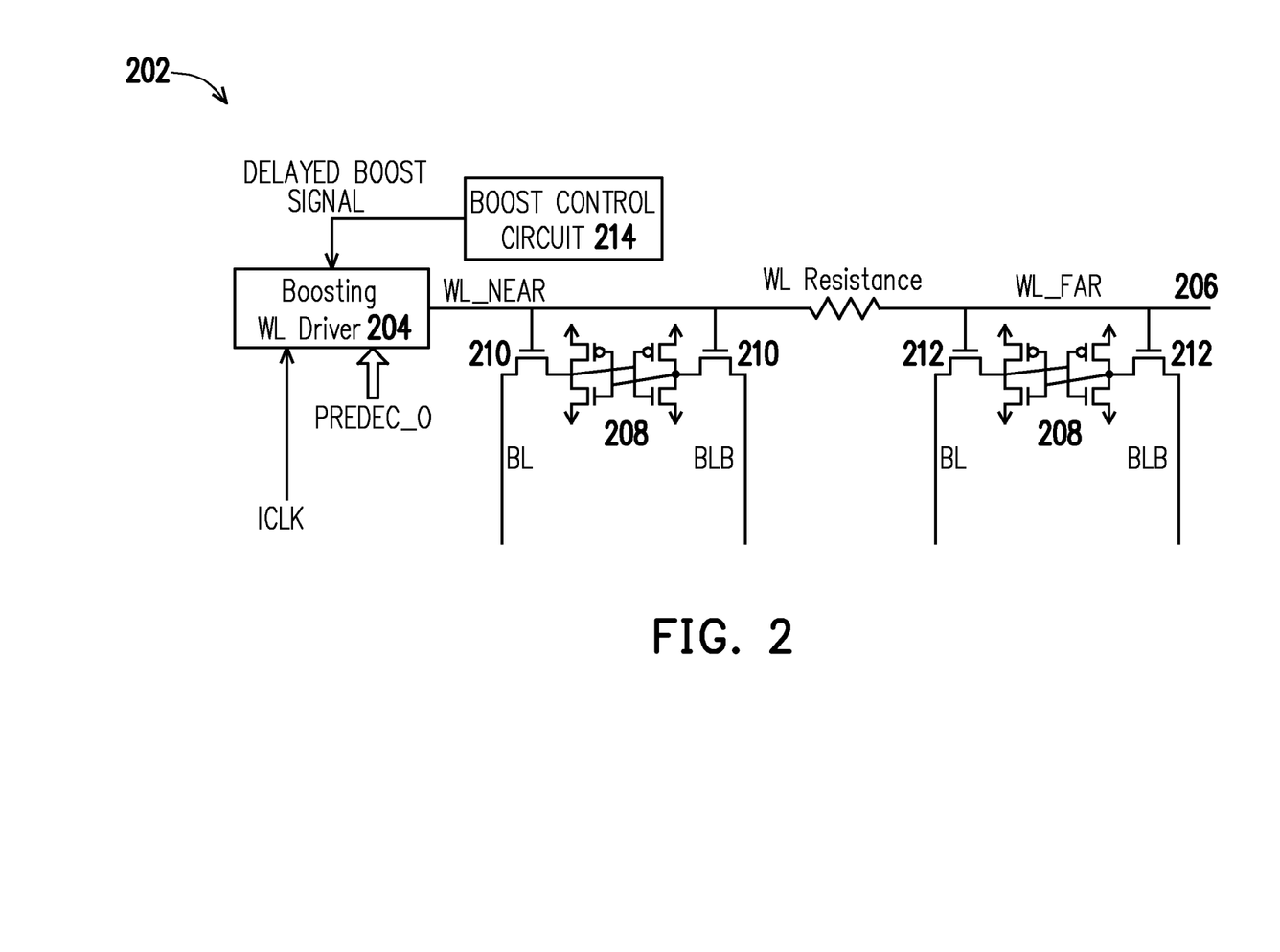
FIG. 2 is a diagram depicting a boosting word line driver controlled by a boost control circuit in accordance with embodiments.

FIG. 2 is a diagram depicting a boosting word line driver controlled by a boost control circuit in accordance with embodiments. The example of FIG. 2 depicts a boosting word line driver 204 that applies a voltage to a word line 206 that controls a plurality of memory cells 208. Specifically, two transistors 210, 212 of each memory cell 208 are positioned between nodes of the memory cell and bit line (BL) and bit line bar (BLB) signal lines. Those transistors 210, 212 operate when they receive a voltage at a control voltage level at their respective gates. In some implementations, a resistance (WL Resistance) is associated with the word line, such that as a signal propagates along the word line 206 from WL_NEAR to WL_FAR, the voltage of the signal received by the transistors 210, 212 changes (e.g., the voltage received at 212 is lower than the voltage received at 210). If that lower voltage received at 212 is less than the control voltage level, memory cells at the far end of the word line 206 could perform improperly. To address this, the boosting word line driver 204 provides a temporarily boosted voltage (e.g., a boosted voltage that is above the control voltage level) so that memory cells at the far end of the word line 206 receive a signal at at least the control voltage level). The boosting word line driver 204 provides the boosted voltage as commanded by a boost control circuit 214 that provides a delayed boost signal (e.g., delayed a period of time substantially equivalent to a propagation time of a particular signal in the system (e.g., from WL_NEAR to WL_FAR)) to the boosting word line driver 204 as described further herein.

Figure 3:
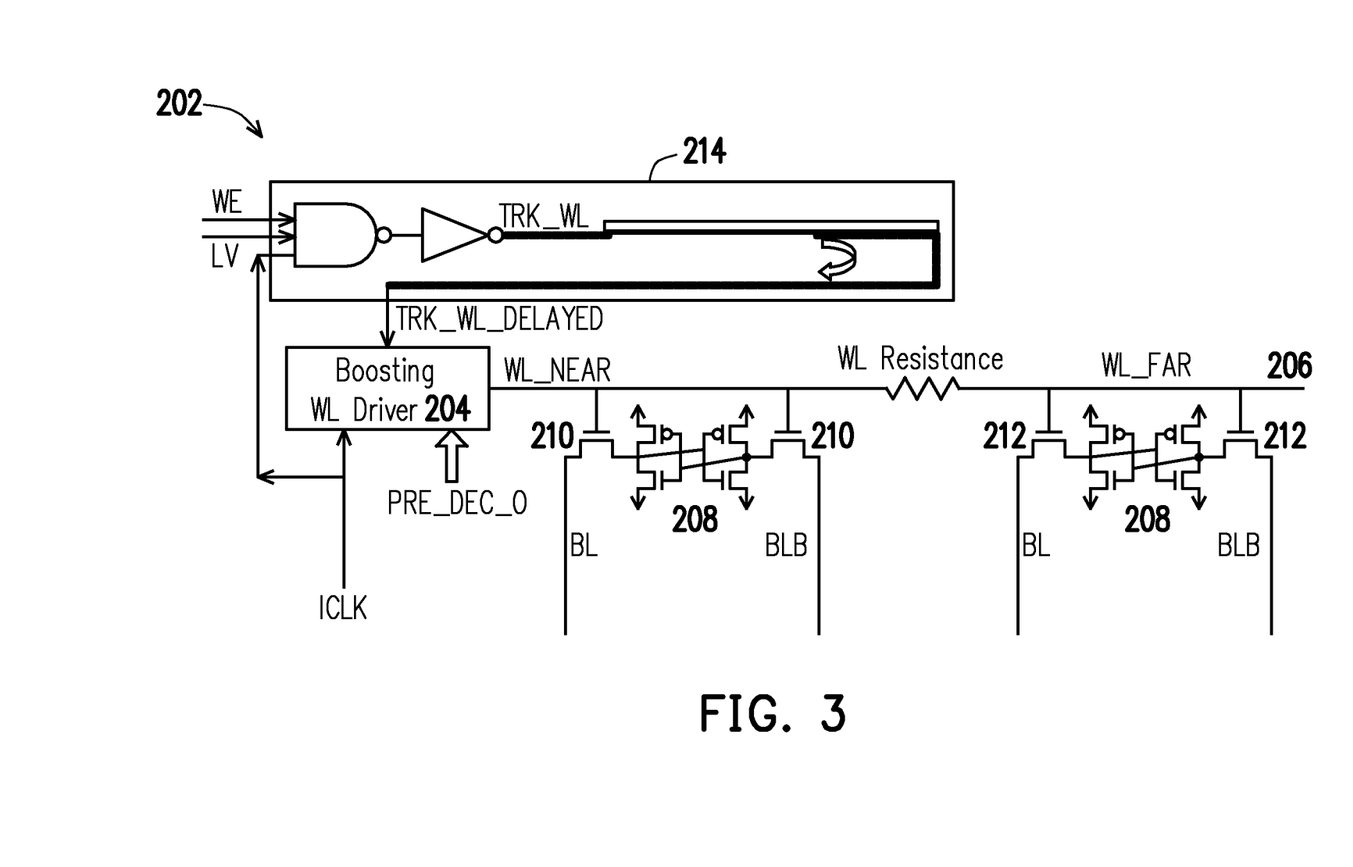
FIG. 3 is a diagram depicting an example boost control circuit in accordance with embodiments.

FIG. 3 is a diagram depicting an example boost control circuit in accordance with embodiments. As described above with reference to FIG. 2, a boosting word line driver 204 provides a voltage to the word line 206 based on a delayed boost command signal (TRK_WL_DELAYED). Specifically, when commanded (e.g., a first selection signal) as ascertained from a pre-decoder signal (PreDec) and the internal clock signal, the boosting word line driver 204 is configured to apply a source voltage level (e.g., a 0.5 v signal that is substantially equivalent to the control voltage level of the transistors 210, 212) to the word line 206. When commanded by the boost control circuit 214 via the TRK_WL_DELAYED signal (e.g., a second selection signal), the boosting word line driver 204 applies the boosted voltage (e.g., 0.56 v) to the word line 206, such that transistors 212 receive the control voltage level (e.g., at least, substantially equal to) after a voltage drop caused by WL Resistance.

The boosting control circuit 214 provides its TRK_WL_DELAYED signal based on three received input signals, a write enable (WE), a low voltage operation signal (LV), and the internal clock signal (ICLK). In embodiments, word line boosting is not necessary during a read cycle, so boosting can be inhibited or activated via control of the WE signal. During high voltage operations that are available in some implementations, boosting is not needed to ensure that memory cells at the far end of the word line 206 receive control signals at the control voltage level. So boosting can also be inhibited or activated via control of the LV signal. When boosting is enabled via appropriate signals on WE and LV, boosting is commanded based on receipt of the ICLK signal. Logic gates, a conductor length within the boost control circuit 214 and between the boost control circuit 214 and the boosting word line driver 204, and other circuit structures are tuned to provide the TRK_WL_DELAYED signal to the boosting word line driver 204 at the desired timing. For example, in one embodiment, the boosting control circuit 214 is configured to provide a delay via an RC loop portion such that the delay from TRK_WL to TRK_WL_DELAYED is substantially similar (e.g., within 1% in certain embodiments where precise matching is preferable, within 10% or 25% in other embodiments where design margins are higher) to the propagation delay of a signal from WL_NEAR to WL_FAR. In embodiments, a transition delay or slope of TRK_WL_DELAYED and WL_FAR is substantially identical.

Figure 4:
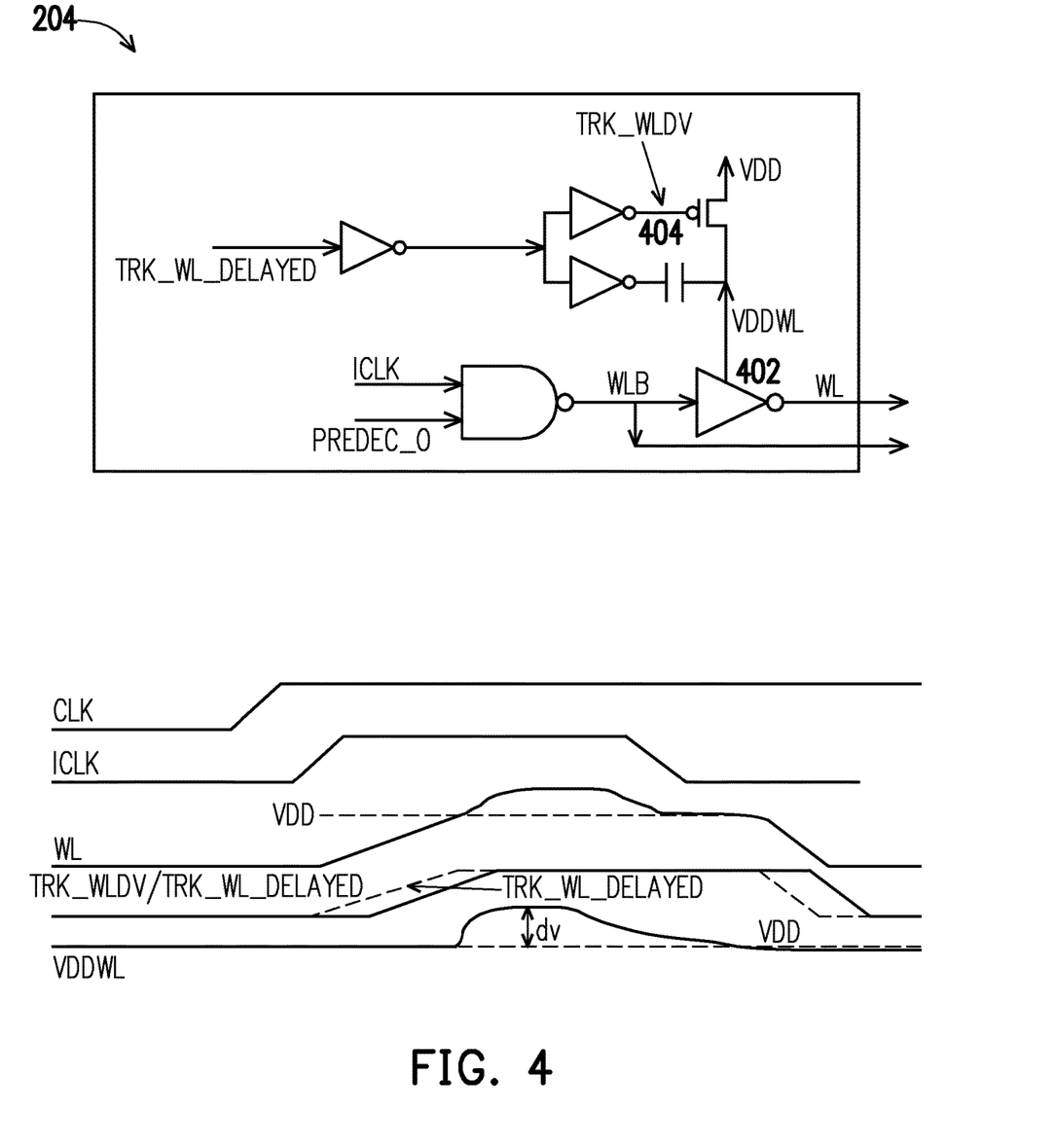
FIG. 4 is a diagram depicting an example implementation of a boosting word line driver in accordance with embodiments.

FIG. 4 is a diagram depicting an example implementation of a boosting word line driver in accordance with embodiments. The boosting word line driver provides signals on a word line (WL) and word line bar (WLB) line as commanded by states of PREDEC_O and ICLK signal (e.g., in combination a first selection signal). Specifically, when an PREDEC_O signal indicates that the associated row of memory cells is to be activated and when the ICLK signals to commence activation, a not-and (NAND) gate provides a low WLB signal and commands WL to a high level via an inverter. The voltage level of that high WL signal is controlled via a supply input 402 (VDDWL).

The base level of VDDWL is at a supply voltage level (VDD). For example, when TRK_WL_DELAYED is at a low level, TRK_WLDV is at a low level, turning the transistor whose gate is controlled by TRK_WLDV on, powering the supply input 402 at the supply voltage level via VDDWL. When TRK_WL_DELAYED transitions high, TRK_WLDV also goes high, turning its corresponding transistor off. At the same time, a capacitor 404 is charged, temporarily boosting the voltage provided to the supply input 402 via VDDWL above the supply voltage level. Thus the output of the inverter to the word line transitions from a low level to the supply voltage level as controlled by the output of the NAND gate (a first selection signal). A boosted voltage above the supply voltage level is then applied to the word line based on the TRK_WL_DELAYED signal (a second signal delayed relative to the first selection signal). The word line receives the boosted voltage for a period of time before that boosted voltage decays back to the supply voltage level (VDD).

Figure 5:
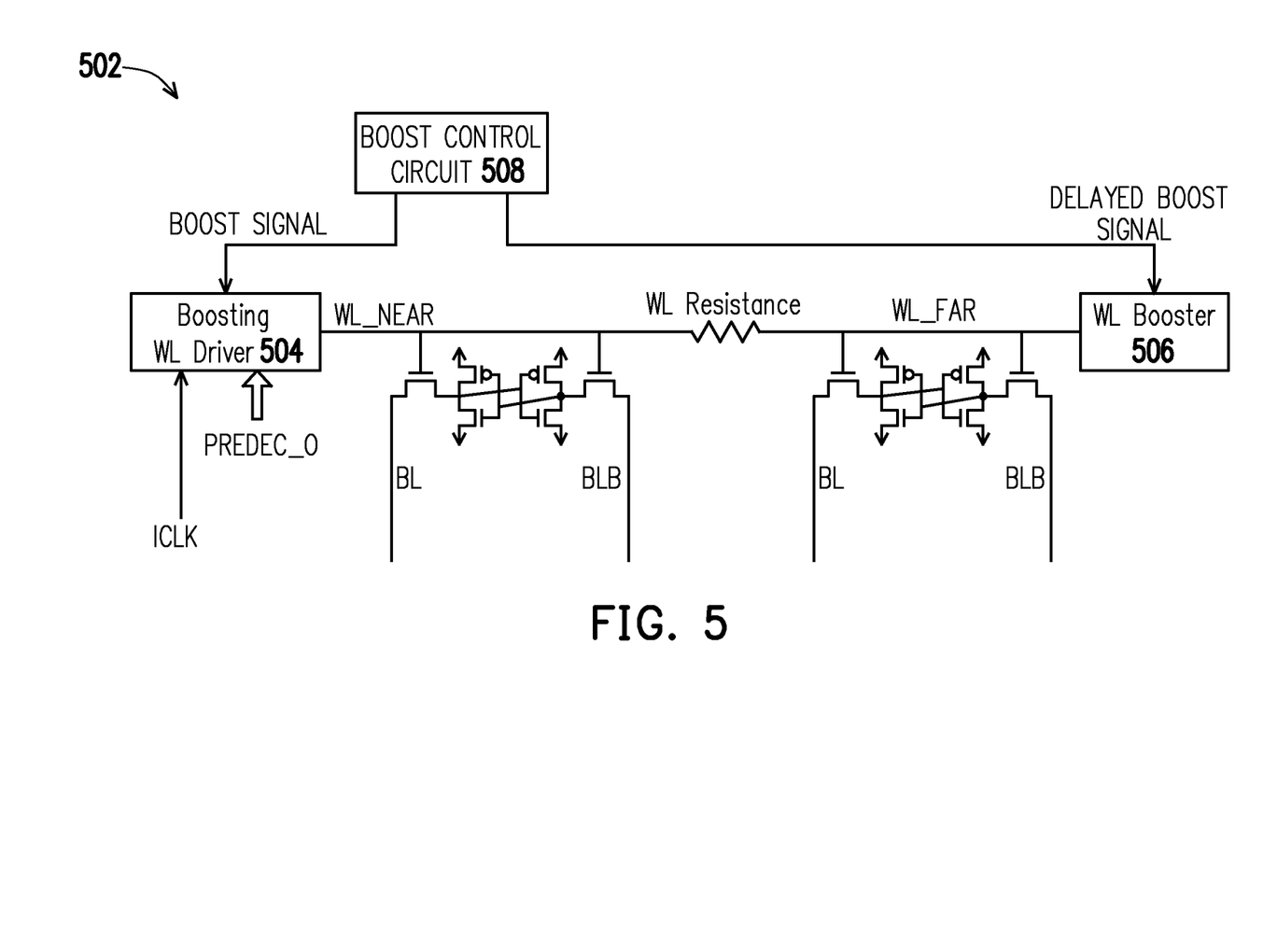
FIG. 5 is a diagram depicting a boost control circuit controlling a word line that is controlled in part by a word line booster in accordance with embodiments.

Boosted voltage techniques as described herein can be applied to many different circuit arrangements. For example, boosted voltage levels may be provided to word line arrangements that include a word line booster at a far end of the word line from a boosting word line driver. FIG. 5 is a diagram depicting a boost control circuit controlling a word line that is controlled in part by a word line booster in accordance with embodiments. The circuit includes a boosting word line driver circuit 504 that is configured to control a voltage at a first end (WL_NEAR) of a word line. A word line booster 506 is configured to control a voltage at a second end (WL_FAR) of the word line. The boosting word line driver 504 and the word line booster 506 are controlled by a boost control circuit 508 that, in one embodiment, provides a boost signal to the boosting word line driver 504 and a delayed boost signal to the word line booster 506. In embodiments, the boost signal and the delayed boost signal are based on a common selection signal (e.g., a first selection signal), where that signal is received at the word line booster 506 after it is received by the boosting word line driver 504 based on propagation delay (e.g., based on a conductor distance, based on circuit components such as inductors and capacitors implemented in the circuit 502).

Figure 6:
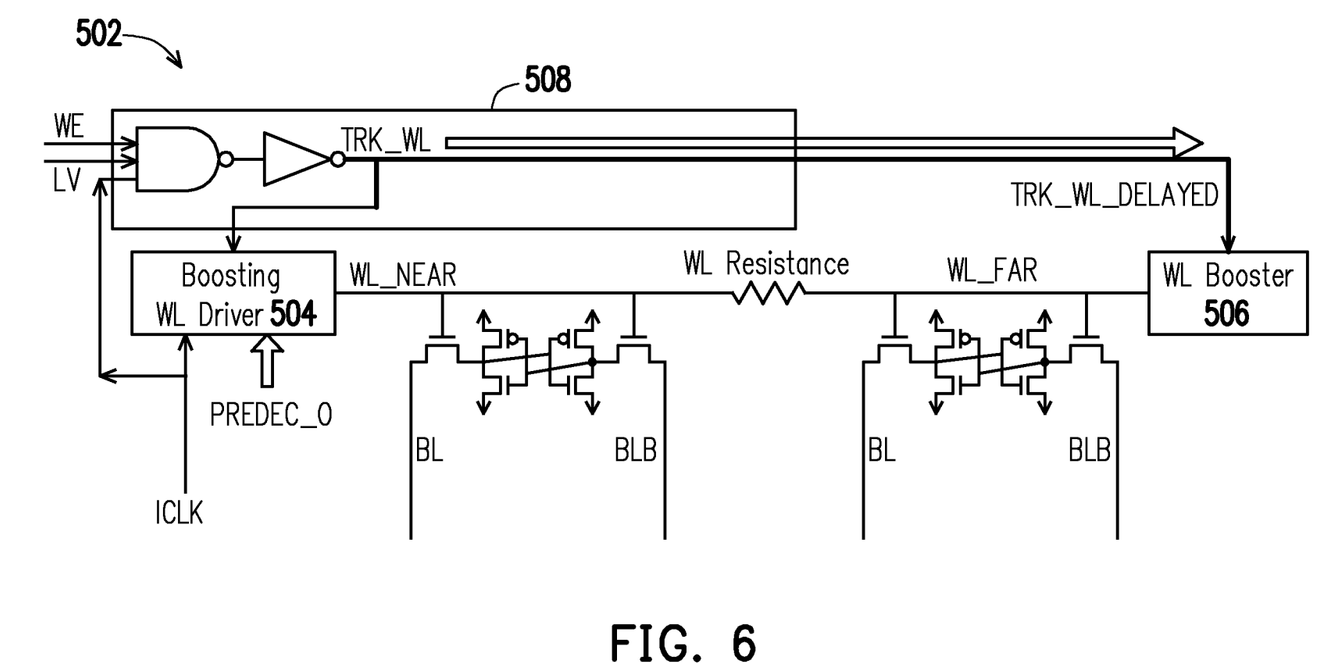
FIG. 6 is a diagram depicting an example implementation of a boost control circuit, such as the boost control circuit of FIG. 5 in accordance with embodiments.

FIG. 6 is a diagram depicting an example implementation of a boost control circuit, such as the boost control circuit of FIG. 5 in accordance with embodiments. Similar to the example of FIG. 3, the boost control circuit generates a control signal (TRK_WL) during low voltage write operations based on WE, LV, and ICLK signals provided to a NAND gate and an inverter. The TRK_WL control signal is provided to the boosting word line driver 504, and the TRK_WL_DELAYED signal is provided to the word line booster 506. In the example of FIG. 6, the signals received at 504, 506 are based on a common TRK_WL signal, with that signal being received at word line booster 506 after receipt at 504 based on a time of propagation from the boost control circuit 508 to the signal destination.

Figure 7:
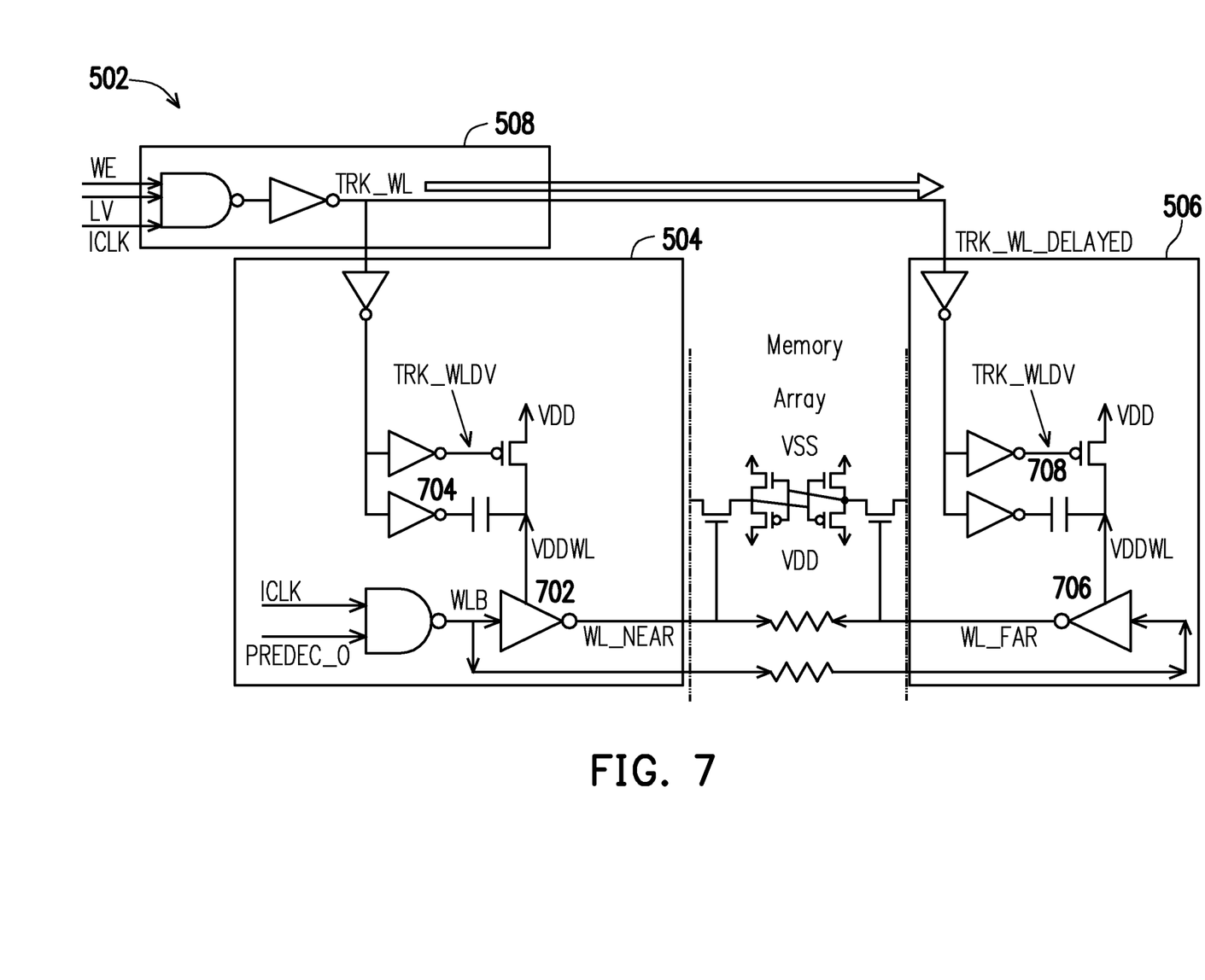
FIG. 7 is a diagram depicting example implementations of a boosting word line driver and word line booster in accordance with embodiments.

FIG. 7 is a diagram depicting example implementations of a boosting word line driver and word line booster in accordance with embodiments. As described above, the boost control circuit 508 generates a control signal (a first selection signal) that is received at both a boosting word line driver circuit 504 and a word line booster circuit 506, with that control signal being received at the word line booster 506 after receipt at 504 based on propagation delay.

With reference to the boosting word line driver 504, the driver 504 provides signals on a word line (WL_NEAR) and word line bar (WLB) line as commanded by states of PREDEC_O (e.g., a write decoder provides a high PREDEC_O signal to the word line driver circuit associated with a row of memory cells associated with a write command) and ICLK signal. Specifically, when an PREDEC_O signal indicates that the associated row of memory cells is to be activated and when the ICLK signals to commence activation, a NAND gate provides a low WLB signal and commands WL to a high level via an inverter. The voltage level of that high WL signal is controlled via a supply input 702 (VDDWL).

The base level of VDDWL is at a supply voltage level (VDD). For example, when TRK_WL (a first selection signal) is at a low level, TRK_WLDV of module 504 is at a low level, turning the transistor whose gate is controlled by TRK_WLDV on, powering the supply input 702 at the supply voltage level via VDDWL. When TRK_WL transitions high, TRK_WLDV also goes high, turning its corresponding transistor off. At the same time, a capacitor 704 is charged, temporarily boosting the voltage provided to the supply input 702 via VDDWL above the supply voltage level. Thus the output of the inverter to the word line at WL_NEAR transitions from a low level to the supply voltage level as controlled by the output of the NAND gate. A boosted voltage above the supply voltage level is then applied to the word line based on the TRK_WL signal. The word line receives the boosted voltage for a period of time before that boosted voltage decays back to the supply voltage level (VDD).

With reference to the word line booster 506, the booster 506 provides signals on the word line (WL_FAR) as commanded by the word line bar signal (WLB) received from the boosting word line driver 504, which is received by an inverter. The voltage level of a high WL signal is controlled via a supply input 706 (VDDWL). The base level of VDDWL is at a supply voltage level (VDD). For example, when TRK_WL_DELAYED (the first selection signal, delayed via propagation from 508) is at a low level, TRK_WLDV of module 506 is at a low level, turning the transistor whose gate is controlled by TRK_WLDV on, powering the supply input 706 at the supply voltage level via VDDWL. When TRK_WL_DELAYED transitions high, TRK_WLDV also goes high, turning its corresponding transistor off. At the same time, a capacitor 708 is charged, temporarily boosting the voltage provided to the supply input 706 via VDDWL above the supply voltage level. Thus the output of the inverter to the word line at end WL_FAR transitions from a low level to the supply voltage level as controlled by the WLB signal. A boosted voltage above the supply voltage level is then applied to the word line based on the TRK_WL_DELAYED signal. The word line receives the boosted voltage for a period of time before that boosted voltage decays back to the supply voltage level (VDD).

Figure 8:
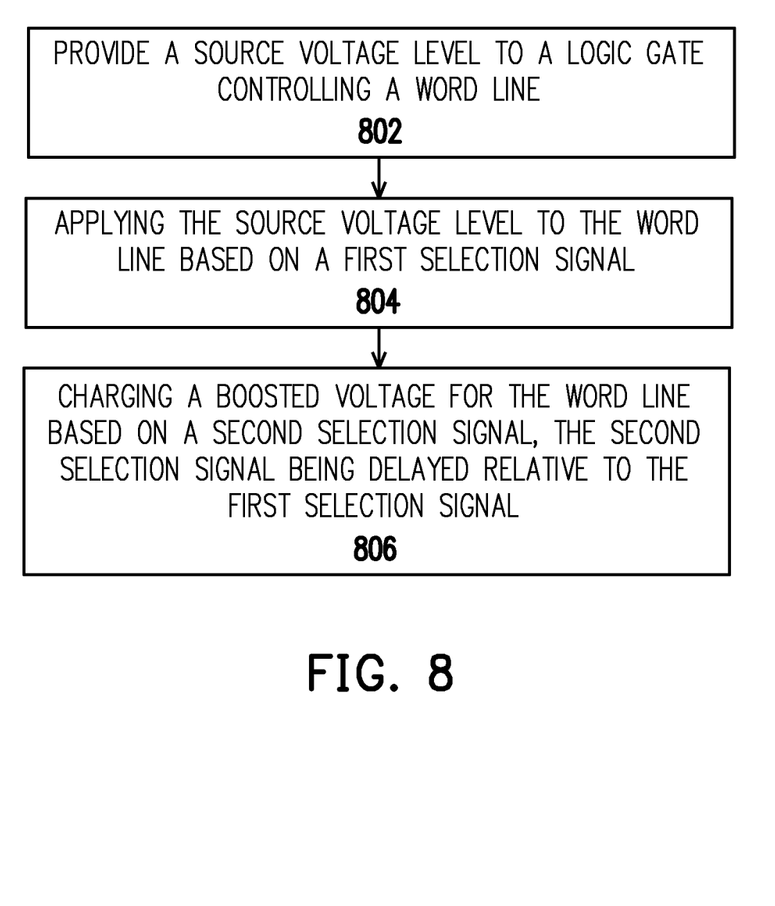
FIG. 8 is a flow diagram depicting a method of controlling a voltage of a word line in accordance with embodiments.

FIG. 8 is a flow diagram depicting a method of controlling a voltage of a word line in accordance with embodiments. While the example of FIG. 8 is described with reference to structures described herein above, the method is applicable to many other structures as well. The method includes providing a source voltage level (VDD) to a logic gate controlling a word line (WL) at 802 and applying the source voltage level to the word line based on a first selection signal (WLB) at 804. At 806, a boosted voltage for the word line (WL) is charged based on a second selection signal (TRK_WL_DELAYED), wherein the second selection signal is delayed relative to the first selection signal.

While certain systems and methods as described herein are illustrated with reference to word line drivers, those systems and methods can be equally applied to other circuit structures. For example, targeted voltage boosts as described herein can, in embodiments, be applied in generating read signals, clock signals, address signals, bit line signals, sense amplifier signals, pre-charge signals, and others.

According to some embodiments, systems and method are provided for a word line driver. A first supply branch is configured to provide a source voltage level for a word line. A second supply branch is configured to provide a boosted voltage for the word line. The word line driver is configured to apply the source voltage level to the word line based on a first selection signal, and the word line driver is configured to apply the boosted voltage to the word line based on a second selection signal, the second selection signal being delayed relative to the first selection signal.

In an embodiment, a word line driver that includes a word line booster includes a word line driver circuit configured to control a voltage at a first end of a word line. A word line booster circuit is configured to control a voltage at a second end of the word line. The word line booster includes a first supply branch configured to provide a source voltage level at the second end of the word line and a second supply branch configured to provide a boosted voltage for the second end of the word line. The word line driver is configured to control the voltage at the first end of the word line based on a first selection signal, and the word line booster is configured to control the voltage at the second end of the word line based on the first selection signal.

In an additional embodiment, a method of controlling a voltage of a word line includes providing a source voltage level to a logic gate controlling a word line and applying the source voltage level to the word line based on a first selection signal. A boosted voltage for the word line is charged based on a second selection signal, wherein the second selection signal is delayed relative to the first selection signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A word line driver, comprising:
    a first supply branch configured to provide a source voltage level for a word line;
    a second supply branch configured to provide a boosted voltage for the word line;
    wherein the word line driver is configured to apply the source voltage level to the word line based on a first selection signal; and
    wherein the word line driver is configured to apply the boosted voltage to the word line based on a second selection signal, the second selection signal being delayed relative to the first selection signal;
    wherein the first selection signal is a logical combination of a pre-decoder signal and an internal clock signal;
    wherein the second selection signal is provided by a boosting control circuit based on the internal clock signal;
    wherein the second selection signal is delayed based on a length of time association with propagation of a word line signal from the word line driver to an end of the word line; and
    wherein the word line driver is configured to apply the boosted voltage to the word line during a write operation but not during a read operation.

2. The word line driver of claim 1, wherein the word line is associated with a plurality of memory cells.

3. The word line driver of claim 2, wherein the word line is associated with at least 1024 memory cells.

4. The word line driver of claim 1, wherein the first supply branch comprises a transistor that is configured to provide the source voltage level when the second selection signal is inactive.

5. The word line driver of claim 4, wherein the second supply branch comprises a capacitor via which the boosted voltage is provided when the second selection signal is activated.

6. The word line driver of claim 1, wherein the source voltage level and the voltage boost are provided to a logic circuit that powers the word line based when the first selection signal is active.

7. A word line driver that includes a word line booster, comprising:
    a word line driver circuit configured to control a voltage at a first end of a word line;
    a word line booster circuit configured to control a voltage at a second end of the word line, the word line booster comprising:
        a first supply branch configured to provide a source voltage level at the second end of the word line based on a signal in a word line bar (WLB) line;
        a second supply branch configured to provide a boosted voltage for the second end of the word line;
        a boosting control circuit configured to supply a first selection signal based on a write enable signal, a low voltage operation signal, and an internal clock signal;
    wherein the word line driver is configured to control the voltage at the first end of the word line based on the first selection signal;
    wherein the word line booster is configured to control the voltage at the second end of the word line based on the first selection signal; and
    wherein the signal in the WLB line is a logical combination of a pre-decoder signal and an internal clock signal.

8. The word line driver of claim 7, wherein the word line booster receives the first selection signal after the word line driver receives the first selection signal based on propagation delay.

9. The word line driver of claim 7, wherein the word line booster circuit is configured to apply the boosted to the voltage word line during a write operation but not during a read operation; and
    wherein the word line booster circuit is configured to inhibit application of the boosted voltage in a high voltage mode of operation.

10. The word line driver of claim 7, wherein the first supply branch comprises a transistor that is configured to provide the source voltage level when the first selection signal is inactive.

11. The word line driver of claim 10, wherein the second supply branch comprises a capacitor via which the boosted voltage is provided when the first selection signal is activated.

12. The word line driver of claim 7, wherein the source voltage level and the boosted voltage are provided to a logic circuit that controls the voltage at the second end of the word line when the first selection signal is active.

13. The word line driver of claim 7, wherein the word line driver circuit comprises:
    a third supply branch configured to provide a source voltage level at the word line;
    a fourth supply branch configured to provide a boosted voltage for the word line.

14. A method of controlling a voltage of a word line, comprising:
    providing a source voltage level to a logic gate controlling a word line;
    applying the source voltage level to the word line based on a first selection signal;
    providing a control signal to a delay signal path to generate a second selection signal, wherein the control signal is generated based on a write enable signal, a low voltage operation signal, and an internal clock signal;
    charging a boosted voltage for the word line based on the second selection signal, wherein the second selection signal is delayed relative to the first selection signal.

15. The method of claim 14, wherein the second selection signal is delayed based on a length of time association with propagation of a word line signal from the word line driver to an end of the word line.

16. The method of claim 14, wherein the boosted voltage decays back to the source voltage level over a decay period of time.

17. The method of claim 16, wherein the boosted voltage maintains a word line voltage at least substantially the source voltage level across the word line.

18. The word line driver of claim 1, wherein the word line is associated with DRAM memory cells.

19. The method of claim 14, wherein the control signal is generated based on a NAND combination of the write enable signal, the low voltage operation signal, and the internal clock signal.

20. The word line driver of claim 1, wherein the boosted voltage maintains a word line voltage at least substantially the source voltage level across the word line.

* * * * *